US012795877B2

(12) United States Patent
Baek

(10) Patent No.: US 12,795,877 B2
(45) Date of Patent: Nov. 10, 2026

(54) DISPLAY DEVICE WITH LAYERED COVER TAPE AND CUTOUT ARRANGEMENT

(71) Applicant: Samsung Display Co., LTD., Yongin-si (KR)

(72) Inventor: Seunggil Baek, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 174 days.

(21) Appl. No.: 18/626,217

(22) Filed: Apr. 3, 2024

(65) Prior Publication Data

US 2025/0016969 A1 Jan. 9, 2025

(30) Foreign Application Priority Data

Jul. 7, 2023 (KR) ........................ 10-2023-0088699

(51) Int. Cl.
*H05K 9/00* (2006.01)
*H10K 59/80* (2023.01)

(52) U.S. Cl.
CPC ......... *H05K 9/0081* (2013.01); *H10K 59/873* (2023.02)

(58) Field of Classification Search
CPC .. H05K 9/0081; H05K 9/0022; H05K 9/0054; H10K 59/873; H10K 59/131; H10K 59/8722; H10K 59/87; H10K 59/129
See application file for complete search history.

(56) References Cited

U.S. PATENT DOCUMENTS

| | | | | |
|---|---|---|---|---|
| 2017/0263887 A1* | 9/2017 | Han | H10K 59/131 |
| 2020/0285338 A1* | 9/2020 | Eom | G06F 3/0412 |
| 2020/0383247 A1* | 12/2020 | Jin | H05K 1/189 |
| 2021/0174044 A1* | 6/2021 | Jo | H05K 1/0216 |
| 2022/0147107 A1* | 5/2022 | Wang | G06F 1/1616 |
| 2022/0209167 A1* | 6/2022 | Park | H10K 59/87 |
| 2022/0322586 A1* | 10/2022 | Li | H05K 9/0081 |
| 2023/0072104 A1* | 3/2023 | Lim | H10K 77/111 |
| 2023/0098923 A1* | 3/2023 | Hwang | H10K 50/844 257/40 |
| 2025/0056980 A1* | 2/2025 | Wu | H10K 59/1315 |

FOREIGN PATENT DOCUMENTS

| | | | |
|---|---|---|---|
| CN | 109496063 B * | 12/2020 | H05K 1/0218 |
| KR | 101575210 B1 | 12/2015 | |
| KR | 1020180033364 A | 4/2018 | |
| KR | 1020220117362 A | 8/2022 | |

* cited by examiner

*Primary Examiner* — Adrian S Wilson
(74) *Attorney, Agent, or Firm* — CANTOR COLBURN LLP

(57) ABSTRACT

A display device includes: a display substrate including a display area and a pad area adjacent to one side of the display area; a driving chip disposed on the pad area of the display substrate; a first circuit board disposed under the display substrate and electrically connected to the pad area; and a cover tape covering each of the driving chip and the first circuit board and including a cutout portion.

18 Claims, 10 Drawing Sheets

DISPLAY DEVICE WITH LAYERED COVER TAPE AND CUTOUT ARRANGEMENT

This application claims priority to Korean Patent Application No. 10-2023-0088699, filed on Jul. 7, 2023, and all the benefits accruing therefrom under 35 U.S.C. § 119, the content of which in its entirety is herein incorporated by reference.

BACKGROUND

1. Field

The present disclosure relates generally to a display device. More particularly, the present disclosure relates to a display device that provides visual information.

2. Description of the Related Art

With the development of information technology, the importance of a display device, which is a connection medium between a user and information, has been highlighted. For example, the use of display devices such as liquid crystal display device ("LCD"), organic light emitting display device ("OLED"), plasma display device ("PDP"), quantum dot display device or the like is increasing.

A display device is driven through various voltages and signals, and accordingly, electromagnetic interference noise ("EMI noise") may be generated in the display device. In order for the display device to perform various functions, various electronic devices (e.g., antennas, GPS, etc.) are integrated into the display device, and the electronic devices operate by forming a network with each other. Malfunction problems of the display device and/or the electronic devices are increasing due to electromagnetic interference noise generated in the display device.

SUMMARY

Embodiments provide a display device with improved adhesive properties of a cover tape that shields electromagnetic interference noise.

A display device according to an embodiment of the present disclosure includes: a display substrate including a display area and a pad area adjacent to one side of the display area, a driving chip disposed on the pad area of the display substrate, a first circuit board disposed under the display substrate and electrically connected to the pad area, and a cover tape covering each of the driving chip and the first circuit board and including a cutout portion.

In an embodiment, the cover tape may include a first portion covering the driving chip, a second portion extending from the first portion and curved with a predetermined curvature, and a third portion extending from the second portion and covering the first circuit board.

In an embodiment, the second portion of the cover tape may include the cutout portion.

In an embodiment, a plurality of openings may be defined in the cutout portion.

In an embodiment, the plurality of openings may be arranged in a line along one direction in a plan view.

In an embodiment, the plurality of openings may be arranged in a zigzag shape in a plan view.

In an embodiment, the display device may further include an encapsulation layer disposed on the display substrate. In addition, the cover tape may extend from under the display substrate onto at least a portion of the encapsulation layer.

In an embodiment, the display device may further include a cover panel disposed under the display substrate. In addition, the first circuit board may be disposed under the cover panel.

In an embodiment, the display device may further include a second circuit board disposed on the display substrate and electrically connected to each of the pad area and the first circuit board. In addition, the cover tape may cover the second circuit board.

A display device according to another embodiment of the present disclosure includes a display substrate including a display area and a pad area adjacent to one side of the display area, a driving chip disposed on the pad area of the display substrate, a first circuit board disposed under the display substrate and electrically connected to the pad area, and a cover tape covering each of the driving chip, including a conductive layer and an insulating layer disposed on the conductive layer, and including a cutout portion curved with a predetermined curvature.

In an embodiment, the insulating layer may include an inorganic material with black color or an organic material with black color.

In an embodiment, the cover tape may further include an adhesive layer disposed under the conductive layer.

In an embodiment, the adhesive layer may include a conductive material.

In an embodiment, in the cutout portion, portions of the insulating layer may be cut.

In an embodiment, in the cutout portion, portions of the conductive layer and portions of the insulating layer may be cut.

In an embodiment, a plurality of openings may be defined in the cutout portion.

In an embodiment, the plurality of openings may be arranged in a line along one direction in a plan view.

In an embodiment, the plurality of openings may be arranged in a zigzag shape in a plan view.

In an embodiment, the display device may further include an encapsulation layer disposed on the display substrate. In addition, the cover tape may extend from under the display substrate onto at least a portion of the encapsulation layer.

In an embodiment, the display device may further include a second circuit board disposed on the display substrate and electrically connected to each of the pad area and the first circuit board. In addition, the cover tape may cover the second circuit board.

A display device according to an embodiment of the present disclosure may include a cover tape that covers a driving chip and a circuit board, and a portion of the cover tape curved with a predetermined curvature may include a cutout portion.

Accordingly, when the cover tape is bent, the repulsive force acting on the portion of the cover tape curved with a predetermined curvature may be reduced. As a result, the cover tape may be smoothly attached to the driving chip. In other words, the phenomenon of partial lifting of the cover tape caused by the cover tape not being attached to the driving chip may be effectively suppressed.

A display device according to another embodiment of the present disclosure may include a cover tape that covers a driving chip and a circuit board, wherein the cover tape may include a conductive layer and an insulating layer disposed on the conductive layer and may include a cutout portion curved with a predetermined curvature.

As the cover tape includes the insulating layer disposed on the conductive layer, the problem of the cover tape being torn during a rework process may be effectively suppressed.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
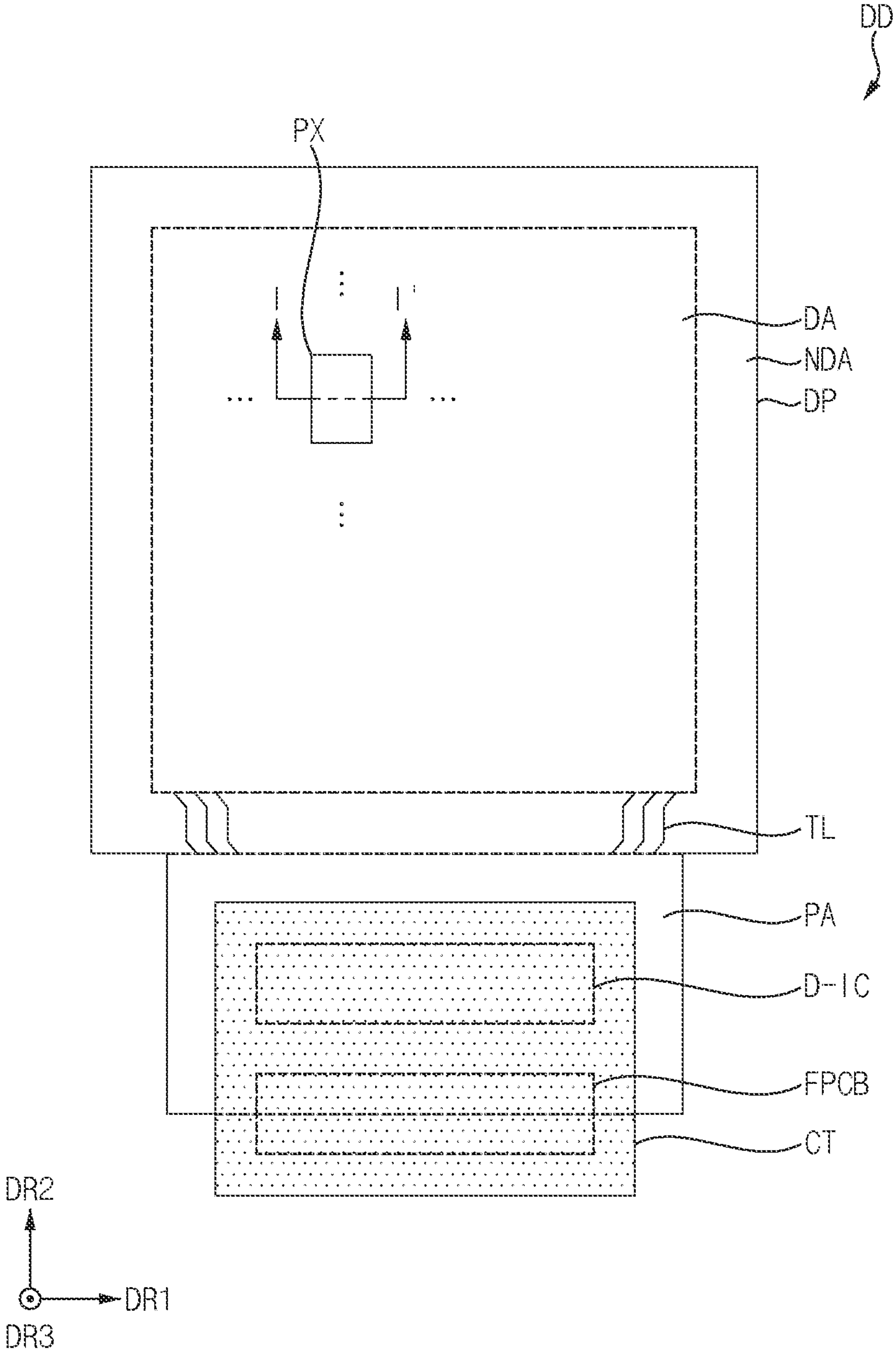
FIG. 1 is a plan view illustrating a display device according to an embodiment of the present disclosure.

It will be understood that when an element is referred to as being "on" another element or "connected to" another element, it can be directly on or directly connected to the other element or intervening elements may be present therebetween. In contrast, when an element is referred to as being "directly on" another element, there are no intervening elements present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Hereinafter, embodiments of the present disclosure will be described in detail with reference to the accompanying drawings. The same reference numerals are used for the same components in the drawings, and redundant descriptions of the same components will be omitted.

FIG. 1 is a plan view illustrating a display device according to an embodiment of the present disclosure.

In this specification, a plane may be defined by a first direction DR1 and a second direction DR2 crossing the first direction DR1. For example, the first direction DR1 and the second direction DR2 may be perpendicular to each other. A third direction DR3 perpendicular to the plane defined by the first direction DR1 and the second direction DR2 may be parallel to a thickness direction of the display substrate DP. As used herein the "plan view" is a view in the third direction DR3.

Referring to FIG. 1, a display device DD according to an embodiment of the present disclosure may include a display substrate DP, a driving chip D-IC, a first circuit board (e.g., a first circuit board PCB of FIG. 3), a second circuit board FPCB, and a first cover tape CT. The display substrate DP may include a display area DA and a non-display area NDA.

A plurality of pixels PX for generating an image may be disposed in the display area DA. The image may be generated by combining light emitted from each of the pixels PX. For example, the pixels PX may be arranged in a matrix form along the first direction DR1 and the second direction DR2.

The non-display area NDA may be positioned around the display area DA. For example, the non-display area NDA may surround the display area DA in a plan view.

The non-display area NDA may include a pad area PA. The pad area PA may be positioned at one side of the display area DA. In an embodiment, for example, the pad area PA may be positioned to be spaced apart from the display area DA in the second direction DR2. The pad area PA may extend in the first direction DR1. A plurality of pads may be disposed in the pad area PA.

The display substrate DP may include a plurality of transmission lines TL connecting the display area DA and the pad area PA. The transmission lines TL may be positioned between the display area DA and the pad area PA. Each of the transmission lines TL may include a first end adjacent to the pad area PA and a second end adjacent to the display area DA, where the first end is opposite to the second end. The first end of each of the transmission lines TL may be connected to a corresponding pad among the pads. The second end of each of the transmission lines TL may be connected to a corresponding line among a plurality of lines (e.g., gate lines, data lines, driving voltage lines, etc.) disposed in the display area DA. The pads and the pixels PX may be electrically connected through the transmission lines TL.

The driving chip D-IC may be disposed on the pad area PA of the display substrate DP. The driving chip D-IC may include a plurality of bumps connected to the pads.

Part of the second circuit board FPCB may be disposed on the pad area PA of the display substrate DP. Specifically, a first end of the second circuit board FPCB may be attached to the display substrate DP so as to overlap a portion of the pad area PA in a plan view. Accordingly, the second circuit board FPCB may be electrically connected to the pad area PA. In an embodiment, for example, the second circuit board FPCB may be a flexible printed circuit board.

The first circuit board (e.g., a first circuit board PCB of FIG. 3) may be disposed under the display substrate DP. The first circuit board may be attached to a second end of the second circuit board FPCB that is opposite to the first end of the second circuit board FPCB. Accordingly, the first circuit board may be electrically connected to the second circuit board FPCB. In addition, the first circuit board may be electrically connected to the pad area PA through the second circuit board FPCB. In an embodiment, for example, the first circuit board may be a printed circuit board.

As the second circuit board FPCB is bent, the second circuit board FPCB may be connected to the first circuit board disposed under the display substrate DP. A detailed description of this will be provided later with reference to FIG. 3.

The driving chip D-IC, the first circuit board, and the second circuit board FPCB may provide driving signals to the display substrate DP. The driving signals may refer to various signals that drive the display substrate DP, such as driving voltage, control signal, data signal, etc. The driving signals may be transmitted to the pixels PX disposed in the display area DA through the pads and transmission lines TL.

The first cover tape CT may cover each of the driving chip D-IC, the first circuit board PCB, and the second circuit board FPCB. Accordingly, the first cover tape CT may protect the driving chip D-IC, the first circuit board PCB, and the second circuit board FPCB.

The first cover tape CT may include a cutout portion (e.g., a cutout portion RP of FIG. 4) curved with a predetermined curvature. A detailed description of this will be provided later with reference to FIGS. 3 and 4.

Figure 2:
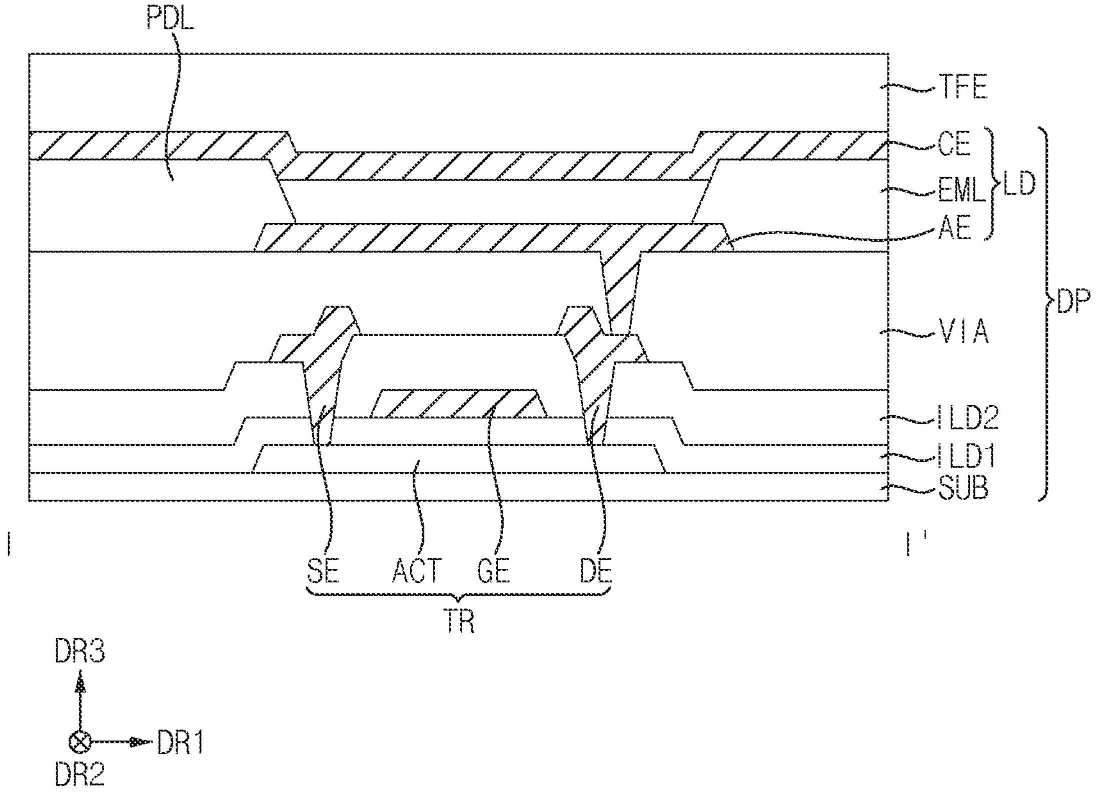
FIG. 2 is a cross-sectional view taken along line I-I' of FIG. 1.

FIG. 2 is a cross-sectional view taken along line I-I' of FIG. 1.

Referring to FIG. 2, the display device DD may include the display substrate DP and an encapsulation layer TFE. The display substrate DP may include a base substrate SUB, a thin film transistor TR, a first insulating layer ILD1, a second insulating layer ILD2, a via-insulating layer VIA, a light emitting element LD, and a pixel defining layer PDL. The thin film transistor TR may include an active layer ACT, a gate electrode GE, a source electrode SE, and a drain electrode DE. The light emitting element LD may include a lower electrode AE, a light emitting layer EML, and an upper electrode CE.

The base substrate SUB may include a transparent material or an opaque material. The base substrate SUB may be formed of or include a transparent resin substrate. A polyimide substrate may be an example of the transparent resin substrate. In this case, the polyimide substrate may include a first organic layer, a first barrier layer, a second organic layer, etc. Alternatively, the base substrate SUB may include a quartz substrate, a synthetic quartz substrate, a calcium fluoride substrate, a fluorine-doped quartz substrate, a soda-lime glass substrate, a non-alkali glass substrate, etc. These may be used alone or in combination with each other.

A buffer layer may be disposed on the base substrate SUB. The buffer layer may prevent diffusion of metal atoms or impurities from the base substrate SUB to an upper structure (e.g., the thin film transistor TR, the light emitting element LD, etc.). In addition, the buffer layer may obtain the substantially uniform active layer ACT by controlling a heat transfer rate during a crystallization process for forming the active layer ACT. In an embodiment, for example, the buffer layer may include an organic insulating material or an inorganic insulating material. Alternatively, the buffer layer may be omitted.

The active layer ACT may be disposed on the base substrate SUB. The active layer ACT may include an oxide semiconductor, a silicon semiconductor, an organic semiconductor, etc. In an embodiment, for example, the oxide semiconductor may include indium (In), gallium (Ga), tin (Sn), zirconium (Zr), vanadium (V), hafnium (Hf), cadmium (Cd), germanium (Ge), chromium (Cr), titanium (Ti), zinc (Zn), etc. These may be used alone or in combination with each other. The silicon semiconductor may include amorphous silicon, polycrystalline silicon, etc. The active layer ACT may include a source area, a drain area, and a channel area positioned between the source area and the drain area.

The first insulating layer ILD1 may be disposed on the active layer ACT and the base substrate SUB. The first insulating layer ILD1 may covers the active layer ACT on the base substrate SUB and may be disposed along the profile of the active layer ACT with a substantially uniform thickness. Alternatively, the first insulating layer ILD1 may sufficiently cover the active layer ACT on the base substrate SUB and may have a substantially flat upper surface without creating a step difference around the active layer ACT. A contact hole may be defined in the first insulating layer ILD1. The contact hole may expose a portion of the active layer ACT. The first insulating layer ILD1 may include a silicon compound, a metal oxide, etc. Examples of the silicon compound may include a silicon compound, a metal oxide, etc. Examples of the silicon compound may include silicon oxide ($SiO_x$), silicon nitride ($SiN_x$), silicon oxynitride ($SiO_xN_y$), etc. These may be used alone or in combination with each other. The first insulating layer ILD1 may electrically insulate the active layer ACT and the gate electrode GE.

The gate electrode GE may be disposed on the first insulating layer ILD1. The gate electrode GE may overlap the active layer ACT in a plan view. The gate electrode GE may include a metal, an alloy, a metal nitride, a conductive metal oxide, a transparent conductive material, etc. Examples of material that may be used as the gate electrode GE may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), etc. These may be used alone or in combination with each other.

The second insulating layer ILD2 may be disposed on the gate electrode GE and the first insulating layer ILD1. The second insulating layer ILD2 may cover the gate electrode GE on the first insulating layer ILD1 and may be disposed along the profile of the gate electrode GE with a substantially uniform thickness. Alternatively, the second insulating layer ILD2 may sufficiently cover the gate electrode GE on the first insulating layer ILD1 and may have a substantially flat upper surface without creating a step difference around the gate electrode GE. A contact hole may be defined in the second insulating layer ILD2. The contact hole may expose a portion of the active layer ACT. The second insulating layer ILD2 may include a silicon compound, metal oxide, etc. The second insulating layer ILD2 may electrically insulate the gate electrode GE and the source electrode SE. In addition, the second insulating layer ILD2 may electrically insulate the gate electrode GE and the drain electrode DE.

The source electrode SE and the drain electrode DE may be disposed on the second insulating layer ILD2. Each of the source electrode SE and the drain electrode DE may be electrically connected to the active layer ACT through a contact hole formed through the first insulating layer ILD1 and the second insulating layer ILD2. Each of the source electrode SE and drain electrode DE may include a metal, alloy, metal nitride, conductive metal oxide, transparent conductive material, etc. These may be used alone or in combination with each other.

Accordingly, the thin film transistor TR including the active layer ACT, the gate electrode GE, the source electrode SE, and the drain electrode DE may be formed.

The via-insulating layer VIA may be disposed on the second insulating layer ILD2. In an embodiment, for example, the via-insulating layer VIA may be disposed on the second insulating layer ILD2 with a relatively thick thickness to sufficiently cover the source electrode SE and the drain electrode DE. A contact hole may be defined in the via-insulating layer VIA. The contact hole may expose a portion of the drain electrode DE. The via-insulating layer VIA may include an organic insulating material or an inorganic insulating material. Examples of the organic insulating material that may be used as the via-insulating layer VIA may include photoresist, polyacryl-based resin, polyimide-based resin, polyamide-based resin, siloxane-based resin, acryl-based resin, epoxy-based resin, etc. These may be used alone or in combination with each other.

The lower electrode AE may be disposed on the via-insulating layer VIA. The lower electrode AE may be electrically connected to the drain electrode DE through a contact hole formed through the via-insulating layer VIA. Accordingly, the lower electrode AE may be electrically connected to the thin film transistor TR. In an embodiment, for example, the lower electrode AE may be a transmissive (or semi-transmissive) electrode or a reflective electrode. The lower electrode AE may include a metal, an alloy, a metal nitride, a conductive metal oxide, a transparent conductive material, etc. These may be used alone or in combination with each other. In an embodiment, for example, the lower electrode AE may serve as an anode electrode.

The pixel defining layer PDL may be disposed on the via-insulating layer VIA. The pixel defining layer PDL may cover an edge of the lower electrode AE and may expose a portion of an upper surface of the lower electrode AE. The pixel defining layer PDL may include an organic insulating material or an inorganic insulating material. Examples of the organic insulating material that may be used as the pixel defining layer may include photoresist, polyacryl-based resin, polyimide-based resin, polyamide-based resin, siloxane-based resin, acryl-based resin, epoxy-based resin, etc. These may be used alone or in combination with each other. In an embodiment, the pixel defining layer PDL may further include an inorganic material or an organic material including a light blocking material with black color.

The light emitting layer EML may be disposed on the lower electrode AE. The light emitting layer EML may emit light having a specific color (e.g., red, green and/or blue). In an embodiment, the light emitting layer EML may include one or both of an organic light emitting material and a quantum dot. In an embodiment, for example, the light emitting layer EML may include an organic material including a fluorescent or phosphorescent material that emits red, green, blue, or white light. The quantum dot may be a particle having a crystal structure of several to tens of nanometers in size, and may include hundreds to thousands of atoms. The quantum dot may include a fluorescent material or a phosphorescent material, and may produce monochromatic red, green, and blue light.

The upper electrode CE may be disposed on the pixel defining layer PDL and the light emitting layer EML. Specifically, the upper electrode CE may be disposed along the profiles of the pixel defining layer PDL and the light emitting layer EML with a substantially uniform thickness. In an embodiment, for example, the upper electrode CE may include a metal, an alloy, a metal nitride, a conductive metal oxide, a transparent conductive material, etc. These may be used alone or in combination with each other. In an embodiment, for example, the upper electrode CE may serve as a cathode electrode.

Accordingly, the light emitting element LD including the lower electrode AE, the light emitting layer EML, and the upper electrode CE may be formed.

The encapsulation layer TFE may be disposed on the upper electrode CE. The encapsulation layer TFE may prevent impurities, moisture, etc. from penetrating into the light emitting element LD from the outside. The encapsulation layer TFE may include at least one inorganic encapsulation layer and at least one organic encapsulation layer. In an embodiment, for example, the inorganic encapsulation layer may include silicon oxide ($SiO_x$), silicon nitride ($SiN_x$), silicon oxynitride ($SiO_xN_y$), etc., and the organic encapsulation layer may include a cured polymer such as polyacrylate. In an embodiment, the encapsulation layer TFE may include a first inorganic encapsulation layer disposed on the upper electrode CE, an organic encapsulation layer disposed on the first inorganic encapsulation layer, and a second inorganic encapsulation layer disposed on the organic encapsulation layer.

Although the display device DD of the present disclosure is described by limiting the organic light emitting display device (OLED), the configuration of the present disclosure is not limited thereto. In other embodiments, the display device DD may include a liquid crystal display device (LCD), a field emission display device ("FED"), a plasma display device (PDP), an electrophoretic image display device ("EPD"), an inorganic light emitting display device ("ILED"), or a quantum dot display device.

Figure 3:
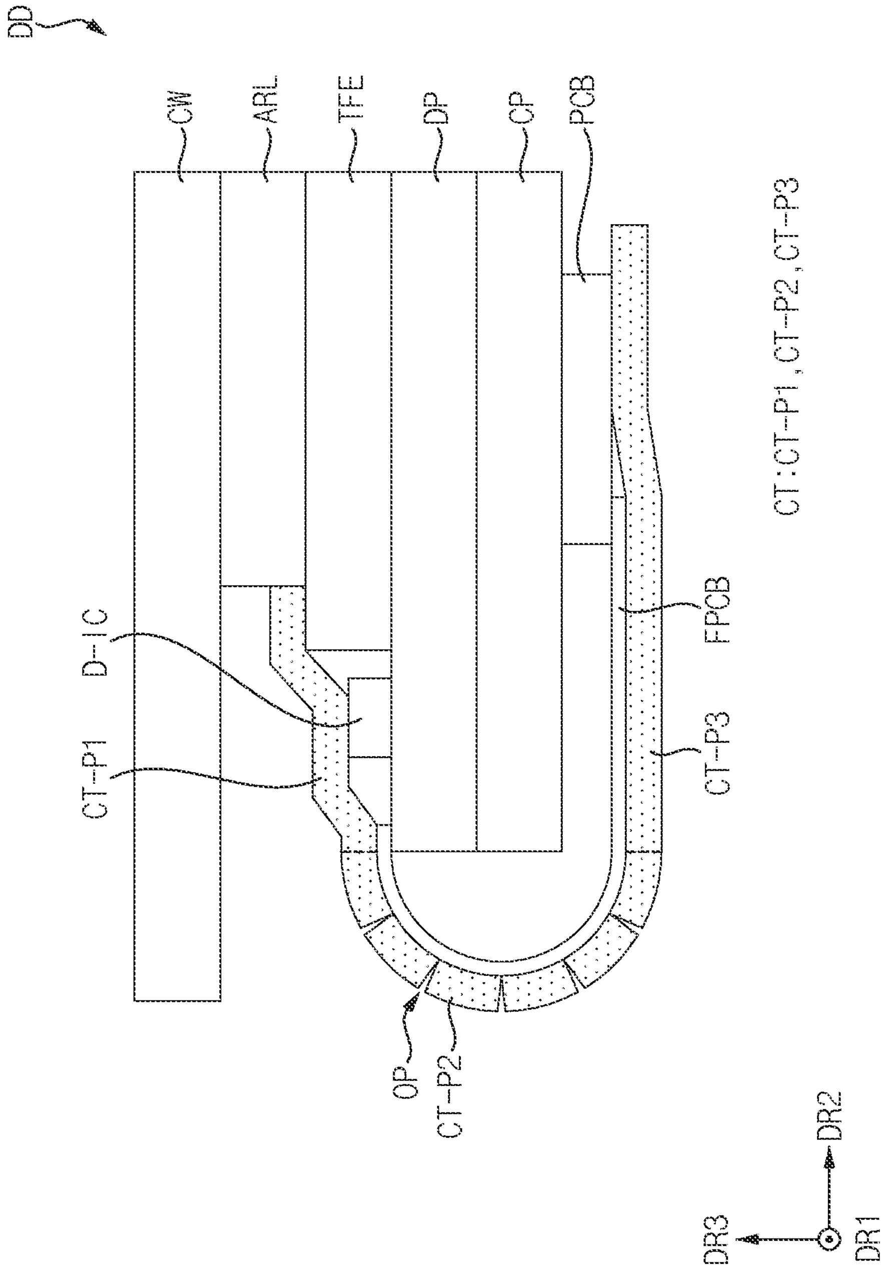
FIG. 3 is a cross-sectional view illustrating the display device of FIG. 1.
Figure 4:
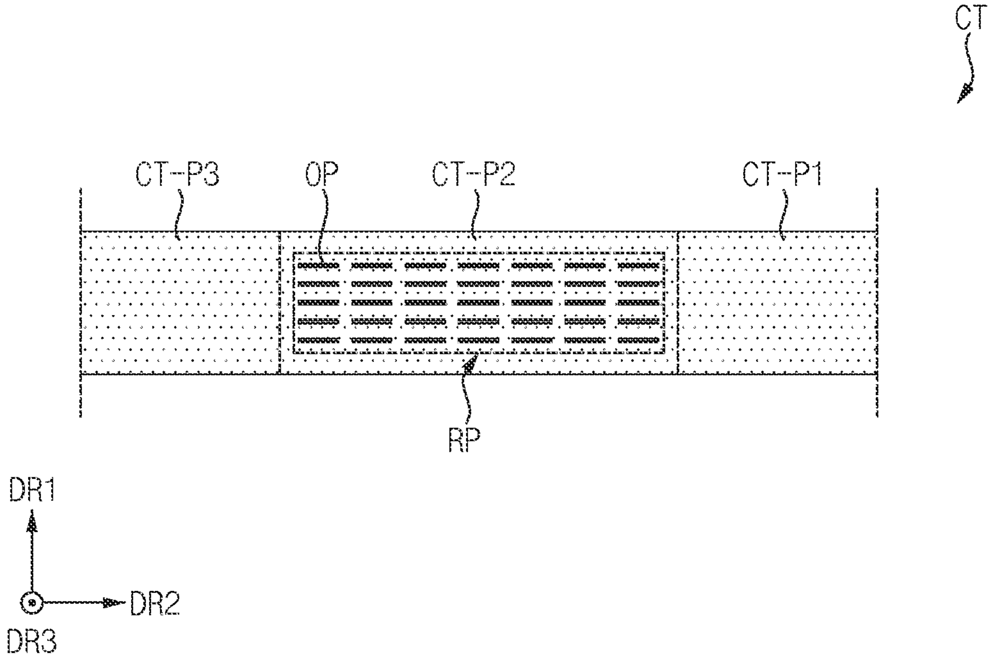
FIG. 4 is a plan view illustrating a first cover tape of FIG. 3.

FIG. 3 is a cross-sectional view illustrating the display device of FIG. 1. FIG. 4 is a plan view illustrating a first cover tape of FIG. 3. For example, FIG. 4 is a plan view illustrating a shape of the first cover tape CT before being bent.

Referring to FIGS. 1, 3 and 4, the display device DD according to an embodiment of the present disclosure may include the display substrate DP, the encapsulation layer TFE, an anti-reflection layer ARL, a cover window CW, a cover panel CP, the driving chip D-IC, the first circuit board PCB, the second circuit board FPCB, and the first cover tape CT.

The encapsulation layer TFE may be disposed on the display substrate DP. The encapsulation layer TFE may include at least one inorganic encapsulation layer and at least one organic encapsulation layer.

The anti-reflection layer ARL may be disposed on the encapsulation layer TFE. External light may enter the display device DD, and the external light may be reflected from various electrodes or lines included in the display substrate DP. The anti-reflection layer ARL may prevent the reflected external light from being visible to the user.

The anti-reflection layer ARL may include a polarizer and a phase retarder. In an embodiment, for example, the anti-reflection layer ARL may include a polarizer and/or a phase retarder of a stretchable film type. The number of the phase retarder and the phase retardation length (λ/4 or λ/2) of the phase retarder may be determined according to the operating principle of the anti-reflection layer ARL. Alternatively, the anti-reflection layer ARL may include color filters and a black matrix disposed between the color filters. The color filters may have a predetermined arrangement. The color filters may be arranged in consideration of the light emitting colors of the pixels included in the display substrate DP.

The cover window CW may be disposed on the anti-reflection layer ARL. The cover window CW may serve to cover and protect the display substrate DP. The cover window CW may be attached to one surface of the display substrate DP through an adhesive member. When the display device DD includes the anti-reflection layer ARL, the cover window CW may be attached to an upper surface of the anti-reflection layer ARL. In an embodiment, for example, the adhesive member may include a pressure sensitive adhesive ("PSA") film, an optically clear adhesive ("OCA") film, an optically clear adhesive resin ("OCR"), etc.

The cover window CW may include a window substrate and a printed layer. The window substrate may include a transparent material. In an embodiment, for example, the window substrate may include glass or plastic. The printed layer may be disposed on the window substrate. The printed layer may be disposed on an edge of the window substrate and may be disposed in the non-display area NDA. The printed layer may include an inorganic material and/or an organic material including a light blocking material with black color. In an embodiment, for example, the light blocking material may include black pigment, black dye, carbon black, etc. These may be used alone or in combination with each other.

The cover panel CP may be disposed under the display substrate DP. The cover panel CP may protect the display substrate DP from external shock. In addition, the cover panel CP may include a metal material to dissipate heat. In an embodiment, for example, the cover panel CP may include aluminum (Al), copper (Cu), etc. These may be used alone or in combination with each other.

The driving chip D-IC may be disposed on the pad area PA of the display substrate DP. The driving chip D-IC may provide driving signals to the display substrate DP. The driving signals may refer to various signals that drive the display substrate DP, such as driving voltage, control signal, data signal, etc.

The second circuit board FPCB may be disposed on the display substrate DP. Specifically, the second circuit board FPCB may be disposed on the display substrate DP to overlap a portion of the pad area PA in a plan view. Accordingly, the second circuit board FPCB may be electrically connected to the pad area PA. Specifically, the second circuit board FPCB may include at least one insulating layer and at least one conductive layer. The conductive layer of the second circuit board FPCB may be connected to the pads disposed on the pad area PA of the display substrate DP through an anisotropic conductive film ("ACF"). Accordingly, the second circuit board FPCB may be electrically connected to the pads.

In an embodiment, for example, the second circuit board FPCB may be a flexible printed circuit board. In other words, the second circuit board FPCB may be bent under the display substrate DP to be connected to the first circuit board PCB disposed under the display substrate DP. Specifically, the second circuit board FPCB may include a first portion disposed on a portion of the pad area PA in a plan view, a second portion extending from the first portion and curved with a predetermined curvature, and a third portion extending from the second portion and disposed under the cover panel CP.

The first circuit board PCB may be disposed under the display substrate DP. Specifically, the first circuit board PCB may be disposed under the cover panel CP. The first circuit board PCB may include at least one insulating layer and at least one conductive layer. The conductive layer of the first circuit board PCB may be connected to the conductive layer of the second circuit board FPCB through an anisotropic conductive film. Accordingly, the first circuit board PCB may be electrically connected to the second circuit board FPCB. In addition, the first circuit board PCB may be electrically connected to the pad area PA through the second circuit board FPCB.

The first cover tape CT may cover each of the driving chip D-IC, the first circuit board PCB, and the second circuit board FPCB. The first cover tape CT may protect the driving chip D-IC, the first circuit board PCB, and the second circuit board FPCB from external shock. In addition, the first cover tape CT may prevent electrostatic discharge ("ESD") of the driving chip D-IC.

In an embodiment, the first cover tape CT may be bent to be disposed under the display substrate DP. Specifically, the first cover tape CT may be bent so that a part of the first cover tape CT may be disposed under the display substrate DP, and the first cover tape CT may cover the driving chip D-IC disposed on the display substrate DP, the first circuit board PCB disposed under the display substrate DP, and the second circuit board FPCB disposed under the display substrate DP. In an embodiment, for example, the first cover tape CT may include a first portion CT-P1 disposed on the display substrate DP, a second portion CT-P2 extending from the first portion CT-P1 and curved with a predetermined curvature, and a third portion CT-P3 extending from the second portion CT-P2 and disposed under the display substrate DP. In this case, the first portion CT-P1 may cover the driving chip D-IC. The second portion CT-P2 may cover the second circuit board FPCB. The third portion CT-P3 may cover the first circuit board PCB.

In an embodiment, the first cover tape CT may extend from under the display substrate DP onto at least a portion of the encapsulation layer TFE. In other words, a portion (e.g., the first portion CT-P1) of the first cover tape CT disposed on the display substrate DP may cover the driving chip D-IC. A part of the portion of the first cover tape CT disposed on the display substrate DP may be disposed on the encapsulation layer TFE.

In an embodiment, the first cover tape CT may include an adhesive layer and a conductive layer disposed on the adhesive layer. In other words, the adhesive layer may be disposed under the conductive layer. The adhesive layer may include an adhesive material. In an embodiment, for example, the adhesive layer may include a pressure sensitive adhesive (PSA) film, an optically clear adhesive (OCA) film, an optically clear adhesive resin (OCR), etc. Accordingly, the first cover tape CT may be attached to the driving chip D-IC, the first circuit board PCB, the second circuit board FPCB, the cover panel CP, and the encapsulation layer TFE by the adhesive layer.

The conductive layer of the first cover tape CT may include a conductive material having magnetic property and an elastic material. In an embodiment, for example, the conductive layer may include aluminum (Al). However, the material included in the conductive layer is not limited thereto. Accordingly, the first cover tape CT may shield electromagnetic interference noise (EMI noise) generated from the first circuit board PCB and the second circuit board FPCB.

In an embodiment, the first cover tape CT may include a cutout portion RP curved with a predetermined curvature. That is, the second portion CT-P2 of the first cover tape CT may include the cutout portion RP. A plurality of openings OP may be defined in the cutout portion RP. In an embodiment, for example, each of the openings OP may have a square planar shape, a circular planar shape, or an oval planar shape in a plan view. However, the present disclosure is not limited thereto, and each of the openings OP may have various planar shapes.

As the first cover tape CT includes the cutout portion RP, the elastic modulus of the first cover tape CT may decrease. Accordingly, when the first cover tape CT is bent, the repulsive force (e.g., elastic restoring force) acting on the second portion CT-P2 of the first cover tape CT may be reduced. As a result, the first cover tape CT may be smoothly attached to the driving chip D-IC and the encapsulation layer TFE. In other words, the phenomenon of partial lifting of the first cover tape CT caused by the first cover tape CT not being attached to the driving chip D-IC and the encapsulation layer TFE may be effectively suppressed.

In an embodiment, as illustrated in FIG. 4, the openings OP may be arranged in a line along one direction in a plan view. That is, the openings OP may be arranged in a line along the first direction DR1 in a plan view. In an embodiment, for example, the openings OP may include a plurality of groups each arranged in a line along the first direction DR1 in a plan view, and the plurality of groups may be arranged along the second direction DR2.

Figure 5:
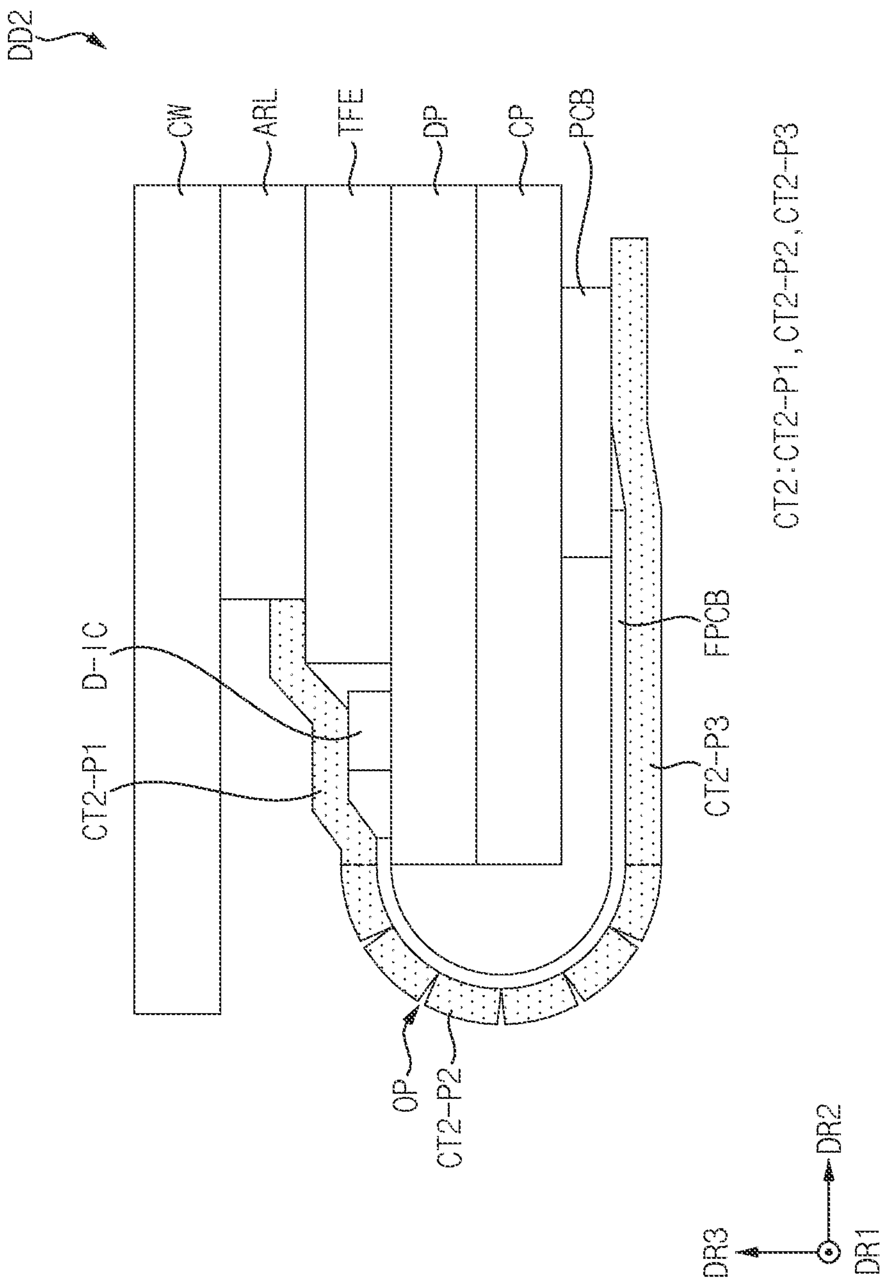
FIG. 5 is a cross-sectional view illustrating a display device according to another embodiment of the present disclosure.
Figure 6:
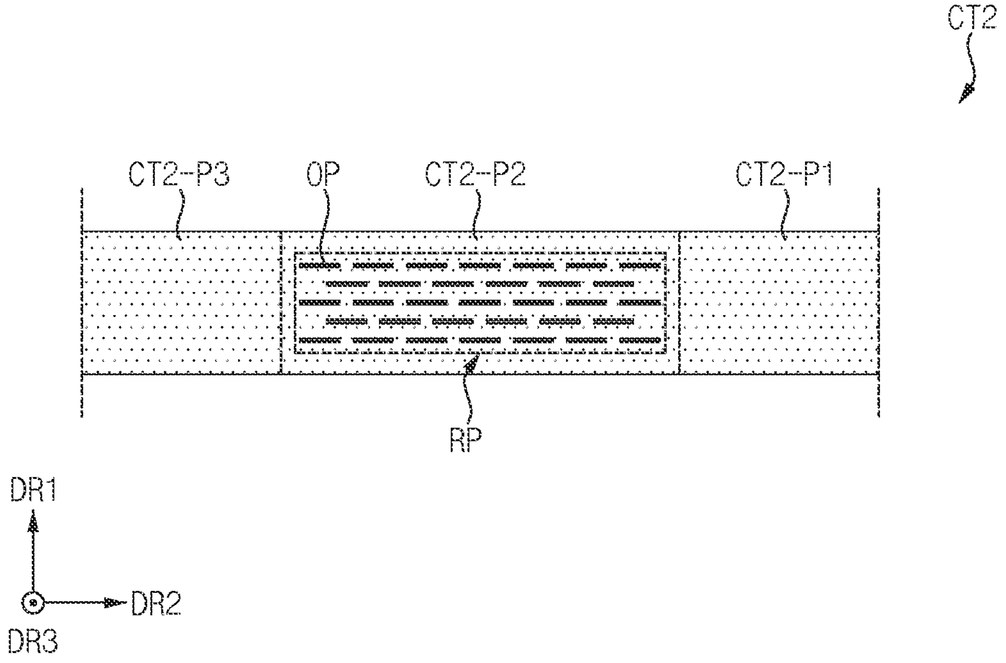
FIG. 6 is a plan view illustrating a second cover tape of FIG. 5.

FIG. 5 is a cross-sectional view illustrating a display device according to still another embodiment of the present disclosure. FIG. 6 is a plan view illustrating a second cover tape of FIG. 5. For example, FIG. 6 is a plan view illustrating the shape of the second cover tape CT2 before being bent.

Referring to FIGS. 5 and 6, a display device DD2 according to another embodiment of the present disclosure may include a display substrate DP, an encapsulation layer TFE, an anti-reflection layer ARL, a cover window CW, a cover panel CP, a driving chip D-IC, a first circuit board PCB, a second circuit board FPCB, and a second cover tape CT2.

The display device DD2 may be substantially the same as the display device DD described with reference to FIGS. 3 and 4 except for the second cover tape CT2. In addition, the second cover tape CT2 may be substantially the same as the first cover tape CT described with reference to FIGS. 3 and 4 except for the shape in which openings OP are arranged in a plan view. Hereinafter, descriptions overlapping descriptions of the display device DD described with reference to FIGS. 3 and 4 will be omitted or simplified.

The second cover tape CT2 may cover each of the driving chip D-IC, the first circuit board PCB, and the second circuit board FPCB. The second cover tape CT2 may be bent so that a part of the second cover tape CT2 may be disposed under the display substrate DP. In an embodiment, for example, the second cover tape CT2 may include a first portion CT2-P1 disposed on the display substrate DP, a second portion CT2-P2 extending from the first portion CT2-P1 and curved with a predetermined curvature, and a third portion CT3-P3 extending from the second portion CT2-P2 and disposed under the display substrate DP. In this case, the first portion CT2-P1 may cover the driving chip D-IC. The second portion CT2-P2 may cover the second circuit board FPCB. The third portion CT2-P3 may cover the first circuit board PCB.

The second cover tape CT2 may include a cutout portion RP curved with a predetermined curvature. That is, the second portion CT2-P2 of the second cover tape CT2 may include the cutout portion RP. A plurality of openings OP may be defined in the cutout portion RP.

In an embodiment, as illustrated in FIG. 6, the openings OP may be arranged in a zigzag shape on in a plan view. That is, the openings OP may be arranged in a zigzag shape with respect to an imaginary line extending along the first direction DR1 in a plan view. In this case, when the second cover tape CT2 is bent, the repulsive force acting on the second portion CT2-P2 of the second cover tape CT2 may be relatively reduced. As a result, the second cover tape CT2 may be more smoothly attached to the driving chip D-IC and the encapsulation layer TFE. In other words, the phenomenon of partial lifting of the second cover tape CT2 caused by the second cover tape CT2 not being attached to the driving chip D-IC and the encapsulation layer TFE may be further suppressed.

Figure 7:
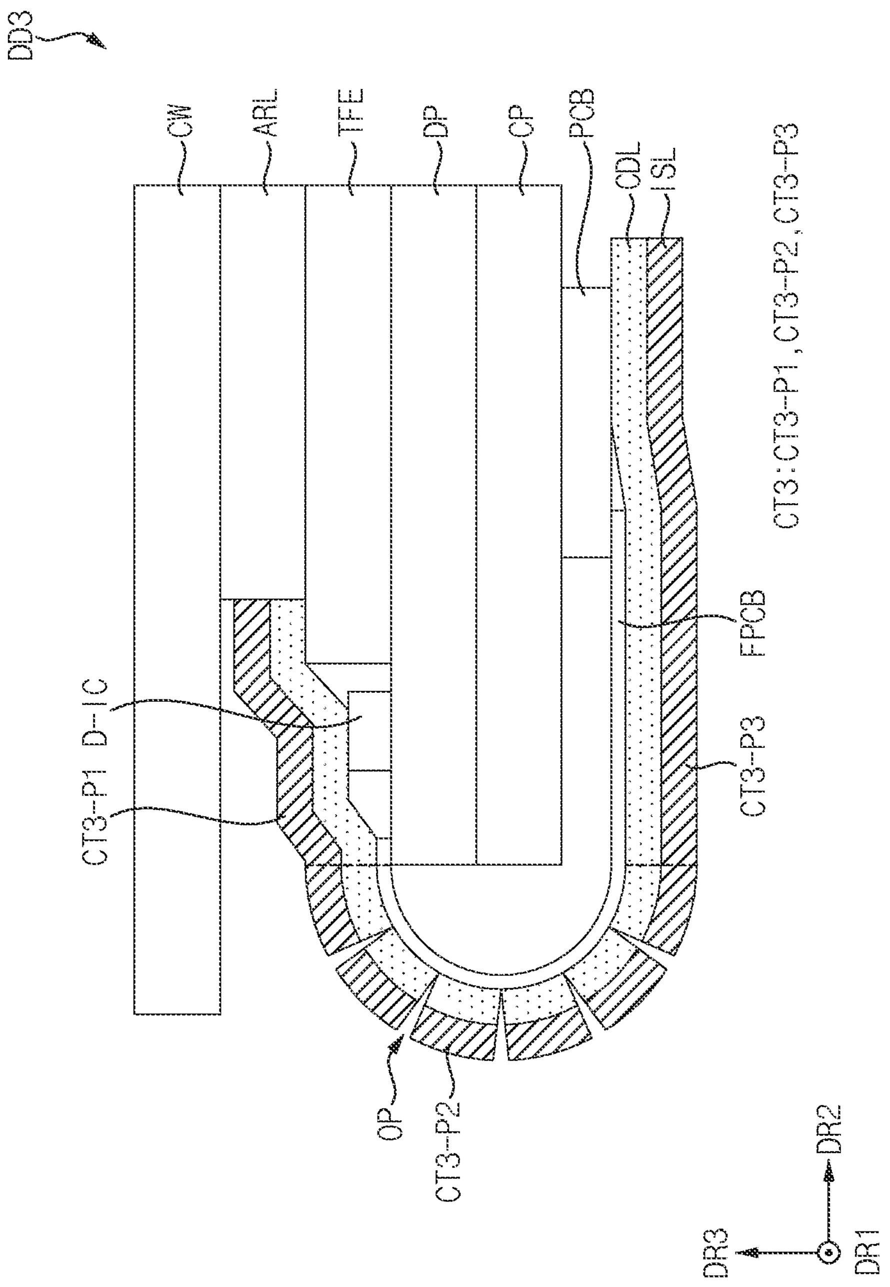
FIG. 7 is a cross-sectional view illustrating a display device according to still another embodiment of the present disclosure.
Figure 8:
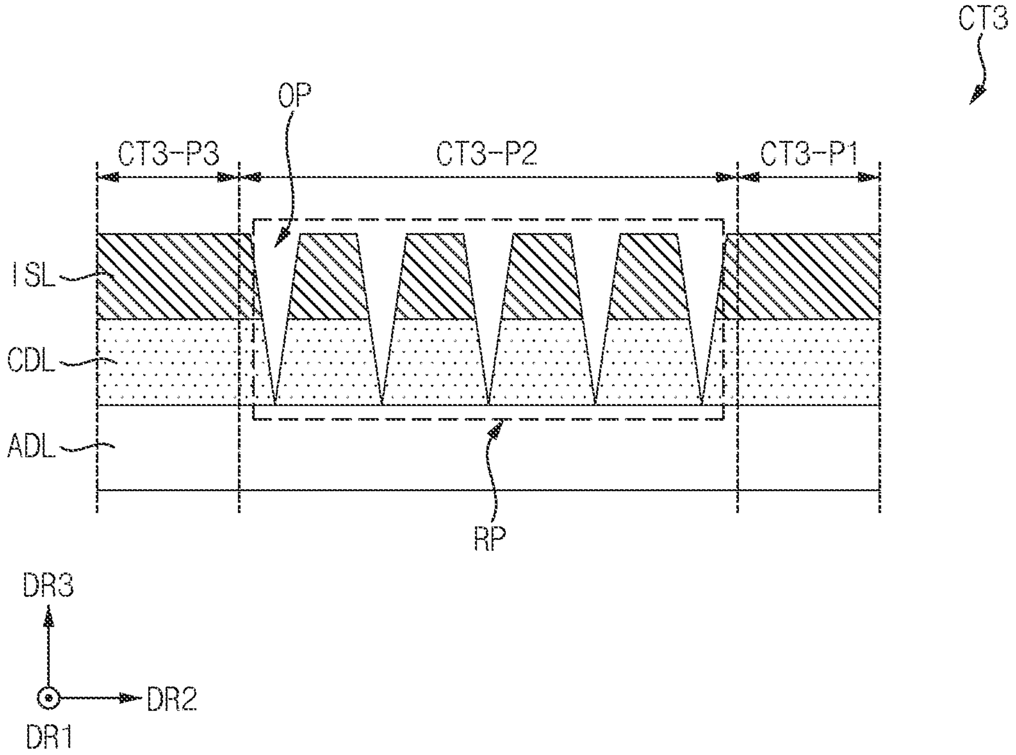
FIG. 8 is a cross-sectional view illustrating a third cover tape of FIG. 7.

FIG. 7 is a cross-sectional view illustrating a display device according to still another embodiment of the present disclosure. FIG. 8 is a cross-sectional view illustrating a third cover tape of FIG. 7. For example, FIG. 8 is a cross-sectional view illustrating the cut shape of a third cover tape CT3.

Referring to FIGS. 7 and 8, a display device DD3 according to still another embodiment of the present disclosure may include a display substrate DP, an encapsulation layer TFE, an anti-reflection layer ARL, a cover window CW, a cover panel CP, a driving chip D-IC, a first circuit board PCB, a second circuit board FPCB, and a third cover tape CT3.

The display device DD3 may be substantially the same as the display device DD described with reference to FIGS. 3 and 4 except for the third cover tape CT3. In addition, the third cover tape CT3 may be substantially the same as the first cover tape CT described with reference to FIGS. 3 and 4, except that the third cover tape CT3 further includes an insulating layer ISL on the conductive layer CDL. Hereinafter, descriptions overlapping descriptions of the display device DD described with reference to FIGS. 3 and 4 will be omitted or simplified.

The third cover tape CT3 may cover each of the driving chip D-IC, the first circuit board PCB, and the second circuit board FPCB. The third cover tape CT3 may be bent so that a part of the third cover tape CT3 may be disposed under the display substrate DP. In an embodiment, for example, the third cover tape CT3 may include a first portion CT3-P1 disposed on the display substrate DP, a second portion CT3-P2 extending from the first portion CT3-P1 and curved with a predetermined curvature, and a third portion CT3-P3 extending from the second portion CT3-P2 and disposed under the display substrate DP. In this case, the first portion CT3-P1 may cover the driving chip D-IC. The second portion CT3-P2 may cover the second circuit board FPCB. The third portion CT3-P3 may cover the first circuit board PCB.

In an embodiment, as illustrated in FIG. 8, the third cover tape CT3 may include an adhesive layer ADL, a conductive layer CDL, and an insulating layer ISL.

The adhesive layer ADL may be disposed under the conductive layer CDL. The adhesive layer ADL may include an adhesive material. Accordingly, the third cover tape CT3 may be attached to the driving chip D-IC, the first circuit board PCB, the second circuit board FPCB, the cover panel CP, and the encapsulation layer TFE. In an embodiment, the adhesive layer ADL may further include a conductive material. In other words, the adhesive layer ADL may be an adhesive layer in which an electromagnetic absorbing material is embedded.

The conductive layer CDL may be disposed on the adhesive layer ADL. The conductive layer CDL may include a conductive material having magnetic property and an elastic material. In an embodiment, for example, the conductive layer CDL may include aluminum (Al). Accordingly, the third cover tape CT3 may shield electromagnetic interference noise (EMI noise) generated from the first circuit board PCB and the second circuit board FPCB.

The insulating layer ISL may be disposed on the conductive layer CDL. The insulating layer ISL may include an organic insulating material. In an embodiment, for example, the insulating layer ISL may include polyethylene terephthalate ("PET"). As the third cover tape CT3 includes the insulating layer ISL, the problem of the third cover tape CT3 being torn during a rework process may be effectively suppressed. In addition, as the third cover tape CT3 includes the insulating layer ISL, the third cover tape CT3 may effectively shield electromagnetic interference noise (EMI noise) generated from the first circuit board PCB and the second circuit board FPCB.

In an embodiment, the insulating layer ISL may further include an inorganic material with black color or an organic material with black color. Accordingly, the third cover tape CT3 may prevent external light reflected by electrodes or lines included in the display substrate DP from being visible to the user.

The third cover tape CT3 may include a cutout portion RP curved with a predetermined curvature. That is, the second portion CT3-P2 of the third cover tape CT3 may include the cutout portion RP. A plurality of openings OP may be defined in the cutout portion RP. In an embodiment, the openings OP may be arranged in a line along one direction in a plan view. In another embodiment, the openings OP may be arranged in a zigzag shape in a plan view.

In an embodiment, as illustrated in FIG. 8, the cutout portion RP may be defined as a part of the third cover tape CT3 where portions of the conductive layer CDL and portions of the insulating layer ISL are cut.

Figure 9:
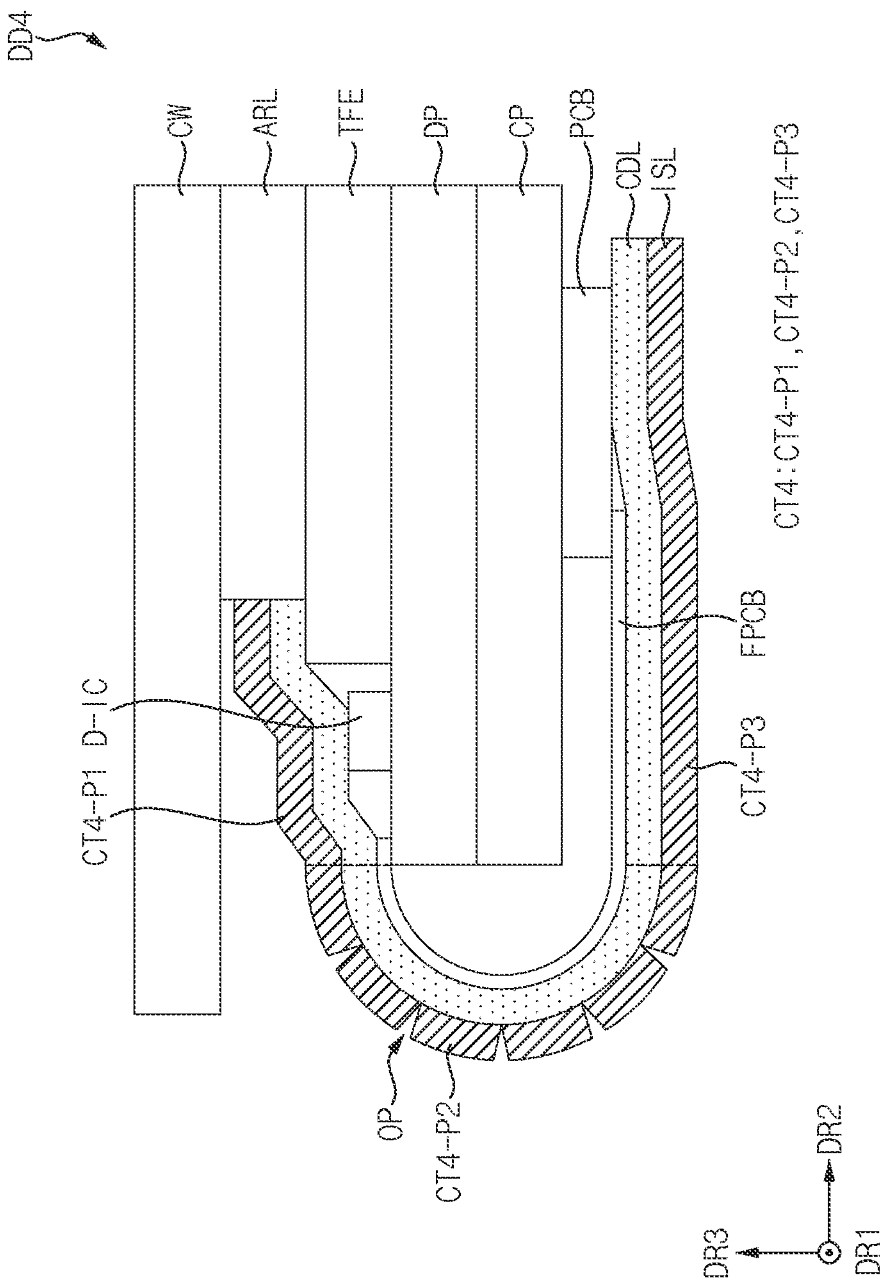
FIG. 9 is a cross-sectional view illustrating a display device according to still another embodiment of the present disclosure.
Figure 10:
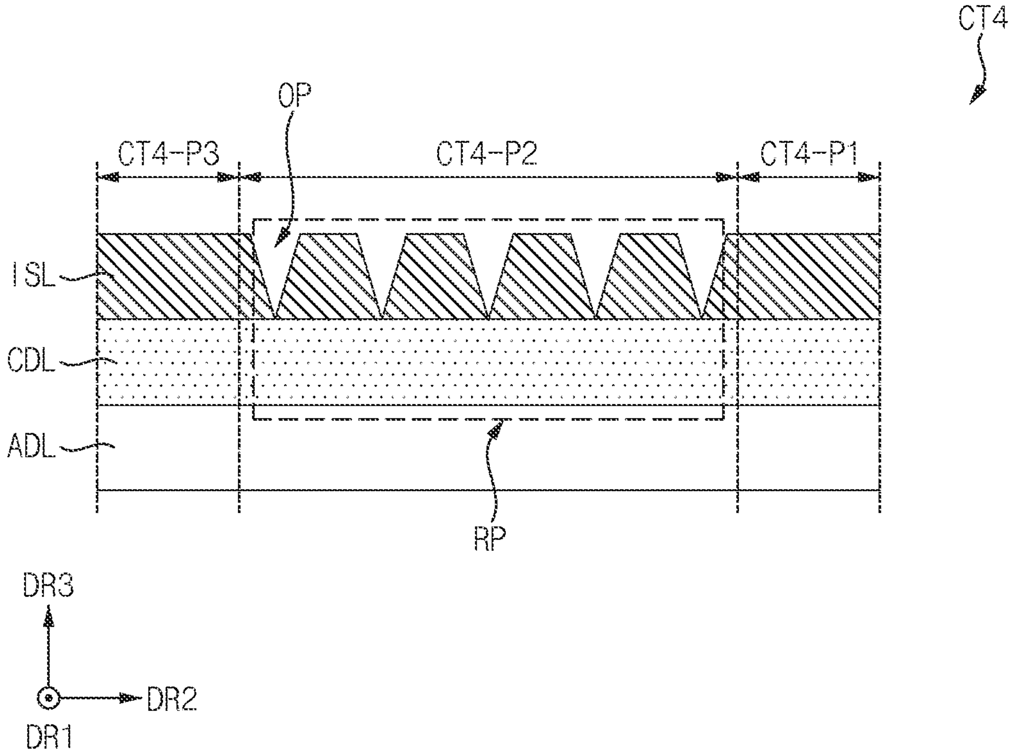
FIG. 10 is a cross-sectional view illustrating a fourth cover tape of FIG. 9.

FIG. 9 is a cross-sectional view illustrating a display device according to still another embodiment of the present disclosure. FIG. 10 is a cross-sectional view illustrating a fourth cover tape of FIG. 9. For example, FIG. 10 is a cross-sectional view illustrating the cut shape of a fourth cover tape CT4.

Referring to FIGS. 9 and 10, a display device DD4 according to still another embodiment of the present disclosure may include a display substrate DP, an encapsulation layer TFE, an anti-reflection layer ARL, a cover window CW, a cover panel CP, a driving chip D-IC, a first circuit board PCB, a second circuit board FPCB, and a fourth cover tape CT4.

The display device DD4 may be substantially the same as the display device DD3 described with reference to FIGS. 7 and 8 except for the fourth cover tape CT4. In addition, the fourth cover tape CT4 may be substantially the same as the third cover tape CT3 described with reference to FIGS. 7 and 8 except for the shape of a cutout portion RP in cross section. Hereinafter, descriptions overlapping descriptions of the display device DD3 described with reference to FIGS. 7 and 8 will be omitted or simplified.

The fourth cover tape CT4 may cover each of the driving chip D-IC, the first circuit board PCB, and the second circuit board FPCB. The fourth cover tape CT4 may be bent so that a part of the fourth cover tape CT4 may be disposed under the display substrate DP. In an embodiment, for example, the fourth cover tape CT4 may include a first portion CT4-P1 disposed on the display substrate DP, a second portion CT4-P2 extending from the first portion CT4-P1 and curved with a predetermined curvature, and a third portion CT4-P3 extending from the second portion CT4-P2 and disposed under the display substrate DP. In this case, the first portion CT4-P1 may cover the driving chip D-IC. The second portion CT4-P2 may cover the second circuit board FPCB. The third portion CT4-P3 may cover the first circuit board PCB.

As illustrated in FIG. 10, the fourth cover tape CT4 may include an adhesive layer ADL, a conductive layer CDL disposed on the adhesive layer ADL, and an insulating layer ISL disposed on the conductive layer CDL.

The fourth cover tape CT4 may include a cutout portion RP curved with a predetermined curvature. That is, the second portion CT4-P2 of the fourth cover tape CT4 may include the cutout portion RP. A plurality of openings OP may be defined in the cutout portion RP. In an embodiment, the cutout portion RP may be defined as a part of the fourth cover tape CT4 where portions of the insulating layer ISL are cut. In other words, the conductive layer CDL may not be cut and may have a substantially flat upper surface compared to the cutout portion RP of the third cover tape CT3 of FIG. 8.

The present disclosure may be applied to various display devices. For example, the present disclosure is applicable to various display devices such as display devices for vehicles, ships and aircraft, portable communication devices, display devices for exhibition or information transmission, medical display devices, and the like.

The foregoing is illustrative of the embodiments of the present disclosure, and is not to be construed as limiting thereof. Although a few embodiments have been described with reference to the figures, those skilled in the art will readily appreciate that many variations and modifications may be made therein without departing from the spirit and scope of the present disclosure as defined in the appended claims.

What is claimed is:

1. A display device comprising:

a display substrate including a display area and a pad area adjacent to one side of the display area;

a driving chip disposed on the pad area of the display substrate;

a first circuit board disposed under the display substrate and electrically connected to the pad area; and a cover tape covering each of the driving chip and the first circuit board, including a conductive layer and an insulating layer disposed on the conductive layer, and including a cutout portion, wherein, in the cutout portion, only the insulating layer of the cover tape is cut.

2. The display device of claim 1, wherein the cover tape includes:

a first portion covering the driving chip;

a second portion extending from the first portion and curved with a predetermined curvature; and a third portion extending from the second portion and covering the first circuit board.

3. The display device of claim 2, wherein the second portion of the cover tape includes the cutout portion.

4. The display device of claim 1, wherein a plurality of openings are defined in the cutout portion.

5. The display device of claim 4, wherein the plurality of openings are arranged in a line along one direction in a plan view.

6. The display device of claim 4, wherein the plurality of openings are arranged in a zigzag shape in a plan view.

7. The display device of claim 1, further comprising:

an encapsulation layer disposed on the display substrate, wherein the cover tape extends from under the display substrate onto at least a portion of the encapsulation layer.

8. The display device of claim 1, further comprising:

a cover panel disposed under the display substrate, wherein the first circuit board is disposed under the cover panel.

9. The display device of claim 8, further comprising:

a second circuit board disposed on the display substrate and electrically connected to each of the pad area and the first circuit board, wherein the cover tape covers the second circuit board.

10. A display device comprising:

a display substrate including a display area and a pad area adjacent to one side of the display area;

a driving chip disposed on the pad area of the display substrate;

a first circuit board disposed under the display substrate and electrically connected to the pad area; and a cover tape covering each of the driving chip and the first circuit board, including a conductive layer and an insulating layer disposed on the conductive layer, and including a cutout portion curved with a predetermined curvature, wherein, in the cutout portion, only the insulating layer of the cover tape is cut.

11. The display device of claim 10, wherein the insulating layer includes an inorganic material with black color or an organic material with black color.

12. The display device of claim 10, wherein the cover tape further includes an adhesive layer disposed under the conductive layer.

13. The display device of claim 12, wherein the adhesive layer includes a conductive material.

14. The display device of claim 10, wherein a plurality of openings are defined in the cutout portion.

15. The display device of claim 14, wherein the plurality of openings are arranged in a line along one direction in a plan view.

16. The display device of claim 14, wherein the plurality of openings are arranged in a zigzag shape in a plan view.

17. The display device of claim 10, further comprising:

an encapsulation layer disposed on the display substrate, wherein the cover tape extends from under the display substrate onto at least a portion of the encapsulation layer.

18. The display device of claim 10, further comprising:

a second circuit board disposed on the display substrate and electrically connected to each of the pad area and the first circuit board, wherein the cover tape covers the second circuit board.

* * * * *